United States Patent
Yudasaka

(10) Patent No.: US 6,541,918 B1
(45) Date of Patent: Apr. 1, 2003

(54) ACTIVE-MATRIX EMITTING APPARATUS AND FABRICATION METHOD THEREFOR

(75) Inventor: Ichio Yudasaka, Chino (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 09/423,724

(22) PCT Filed: Feb. 19, 1999

(86) PCT No.: PCT/JP99/00764

§ 371 (c)(1),
(2), (4) Date: Nov. 12, 1999

(87) PCT Pub. No.: WO99/46748

PCT Pub. Date: Sep. 16, 1999

(30) Foreign Application Priority Data

Mar. 12, 1998 (JP) .......... 10-061786

(51) Int. Cl.[7] .................. G09F 9/30
(52) U.S. Cl. .......... 315/169.3; 313/506; 345/80
(58) Field of Search .......... 315/169.3, 169.4; 313/505, 506; 345/80

(56) References Cited

U.S. PATENT DOCUMENTS 6,147,451 A * 11/2000 Shibata et al. .......... 313/506

FOREIGN PATENT DOCUMENTS

| JP | A-59-232385 | 12/1984 |
|----|----|----|
| JP | A-61-128280 | 6/1986 |
| JP | A-61-142692 | 6/1986 |
| JP | A-63-26633 | 2/1988 |
| JP | U-3-110794 | 11/1991 |
| JP | 08-227276 | 9/1996 |
| JP | 10-134964 | 5/1998 |
| JP | 10-241859 | 9/1998 |

* cited by examiner

Primary Examiner—David Hung Vu
(74) Attorney, Agent, or Firm—Oliff & Berridge, PLC

(57) ABSTRACT

An active-matrix light-emitting apparatus is provided having step-cutting insulation films, each film having upper portions protruding as overhang sections in interlayer portions of pixel electrodes and light-emitting layers in border regions of interpixel sections. Therefore, the light-emitting layers, even when formed so as to overlap a plurality of pixels and to produce step cutting at the overhang sections, are insulated in each of the pixels. Accordingly, crosstalk is avoided in these interpixel sections, and display quality is improved.

17 Claims, 14 Drawing Sheets

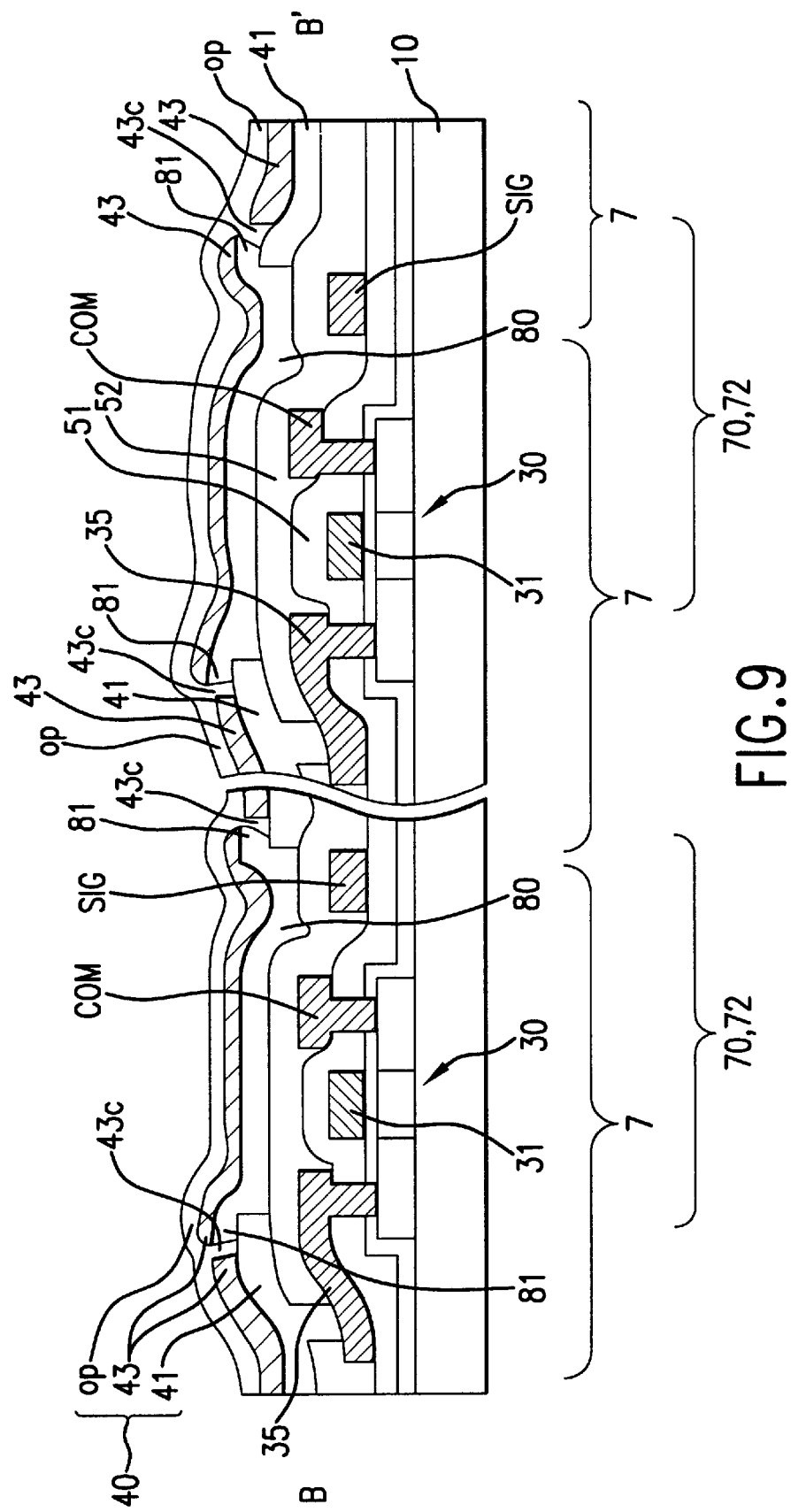

ACTIVE-MATRIX EMITTING APPARATUS AND FABRICATION METHOD THEREFOR

BACKGROUND OF THE INVENTION

1. Field of the Invention

The present invention relates to an active-matrix light-emitting apparatus. In particular, the present invention relates to an active-matrix display apparatus that performs driving-control of electronic devices, such as EL (electroluminescent) devices and LED (light-emitting diode) devices, that are caused to emit light by a driving current flowing to emitting layers such as organic semiconductor films using thin-film transistors (hereinafter, referred to as TFTs), and relates to a fabrication method therefor.

2. Description of Related Art

Active-matrix light-emitting apparatuses, particularly, the apparatuses used for active-matrix type display apparatuses using current-control light-emitting devices, such as EL devices and LED devices, have been proposed. The light-emitting devices used in display apparatuses of this type emit light by themselves. Therefore, unlike liquid crystal display apparatuses, they have advantages in such aspects in that they do not require a backlight and that they are less dependent on viewing angles.

FIG. 1 is a schematic view of a circuit configuration in an active-matrix display apparatus using organic thin-film EL devices of a charge-injection type as current-control light-emitting devices. In the active-matrix display apparatus 1 shown in this figure, switching circuits 50 and light-emitting devices 40 are individually formed for pixels 7, in which the pixels 7 are formed in a matrix by a plurality of scanning lines "gate" and a plurality of data lines "sig", switching circuits 50 are fed with scanning signals through the scanning lines "gate", and the light-emitting devices 40 emit light in response to image signals fed from data lines "sig" through the switching circuits 50. In the illustrated example, each of the switching circuits 50 is formed of a first TFT 20 in which scanning signals are fed to its gate electrode through the scanning line "gate", a capacitor "cap" for storing image signals fed from the data line "sig" through the first TFT 20, and a second TFT 30 in which the image signals stored in the capacitor "cap" are fed to its gate electrode. When the second TFT 30 is turned on, a driving current flows from a common feeder line "com" into the light-emitting device 40 to cause the device to emit light, and the light-emitting state is maintained according to the capacitor "cap".

FIGS. 2 and 3 are plan views of a portion of the pixels shown in FIG. 1. In FIG. 2, conductive films forming elements such as the scanning lines "gate" and capacitor lines "cs" are indicated by lines slanting up to the right; elements such as conductive films forming the data lines "sig" and the common feed lines "com" are indicated by lines slanting down to the right. In FIG. 3, regions in which the light-emitting layers 43 composing the light-emitting devices 40 are formed are indicated by lines slanting down to the right. For reference, in the illustrated example, an insulation film "in" defining the regions in which light-emitting layers 43 are formed is arranged in a border region in which the data line "sig" and the common feed line "com" extend in a border region between the individual pixels 7, therefore, the regions in which the insulation films "in" are formed are indicated by the lines slanting up to the right. In addition, in FIGS. 2 and 3, regions in which semiconductor films forming the first TFTs 20 and the TFTs 30 are formed are indicated by bold lines; regions in which pixel electrodes 41 are formed are indicated by bold dotted lines. In addition, respective cross sections along the lines A–A', B–B', and C–C' in FIGS. 2 and 3 are shown in FIGS. 12, 13, and 14.

In these figures, the first TFT 20 has a structure in which a gate electrode is formed as a part of the scanning line "gate", and the data line "sig" and a storage electrode 22 are respectively formed in a source region and a drain region through a contact hole of an interlayer insulation film 51. The storage electrode 22 extends toward the region in which the second TFT 30 is formed, and a gate electrode 31 of the second TFT 30 is electrically connected through the contact hole in the interlayer insulation film 51 in the foregoing extension portion. The capacitor line "cs" is formed at a side portion of the scanning line "gate", and the capacitor line "cs" is commonly positioned for the drain region of the first TFT 20 and the storage electrode 22 via the first interlayer insulation film 51 and a gate insulation film 55 to form the capacitor "cap". A junction electrode 35 is electrically connected to either one of the drain region and the source region of the first TFT 30 through the contact hole in the first interlayer insulation film 51, and a pixel electrode 41 is electrically connected to the junction electrode 35 through a contact hole in a second interlayer insulation film 52. To the other of the drain region and the source region, the common feeder line "com" is electrically connected through the contact hole in the first interlayer insulation film 51.

The pixel electrode 41 is formed independently for each pixel 7. On an upper side of this pixel electrode 41, a light-emitting layer 43 composing the light-emitting devices 40 and an opposing electrode "op" are overlaid in this order.

In the illustrated example, the insulation film "in" is formed in a region in which the data line "sig" and the common feeder line "com" extend, and the insulation film "in" insulates the light-emitting layers 43 of the light-emitting devices 40 of two pixels 7 which are arranged on both sides of the data line "sig" and the common feeder line "com". However, the insulation film "in" is not formed between the pixels 7 arranged along the data line "sig" and the common feeder line "com". In this direction, the light-emitting layers 43 of the light-emitting device 40 are formed in stripes so as to overlap a plurality of the pixels 7. In this arrangement also, the first TFTs 20 of the individual pixels 7 turn on/off with a predetermined timing in response to scanning signals fed from the scanning lines "gate", therefore, predetermined image signals are written to the individual pixels 7 from the data lines "sig", and a current flows to the light-emitting layers formed in the border lines between the pixels.

In conventional active-matrix display apparatuses, although predetermined image signals from the data lines "sig" can be written to the individual pixels 7, since the light-emitting devices 40 (light-emitting layers 43) have electrical conductivity, a current also flows to between pixels (the border regions between the pixels) arranged along the data lines "sig" and the common feeder lines "com", increasing the probability of occurrence of the so-called crosstalk. In addition, if charge injection layers such as hole injection layers, electron injection layers, and the like are formed in the light-emitting devices 40 in addition to the light-emitting layers for improving the light-emitting characteristics, the resistance of the charge injection layer is smaller than that of the light-emitting layer, and the difference in the resistance might further increase the probability of occurrence of crosstalk between the pixels arranged along the data lines "sig" and the common feeder line "com".

SUMMARY OF THE INVENTION

In view of the above problems, objects of the present invention are to provide an active-matrix light-emitting apparatus and a fabrication method therefor, the active-matrix light-emitting apparatus being such that it has a plurality of pixels and is arranged so as to avoid crosstalk in the vicinity between the pixels, and to provide display of improved quality.

To solve the above problems, the present invention provides an active-matrix display apparatus that has pixel electrodes formed in individual pixels in a matrix by a plurality of scanning lines and a plurality of data lines, light-emitting layers overlying the pixel electrodes, and opposing electrodes formed on the light-emitting layers. The light-emitting devices composed of the light-emitting layers emit light in response to image signals fed from the data lines via a switching circuit. The apparatus includes insulation films between the pixel electrodes and the light-emitting devices, in each of which upper portions at side face sections protrude from a lower portion in the border regions.

In the present invention, step-cutting insulation films, each having the upper portions specifically structured as described above, in interlayer sections of the pixel electrodes and the light-emitting layers, that is, in a lower side of the light-emitting devices, are arranged in border regions in which the light-emitting layers are individually arranged on an upper portion so as to overlap in the border regions of the pixels. Therefore, step-cutting is produced by the upper portions protruding toward the sides of the insulation films in the light-emitting layers formed over the foregoing insulation films. For this reason, even light-emitting layers formed individually so as to overlap interpixel sections can be insulated in the interpixel sections. Even when complete step-cutting does not occur in the light-emitting layers, but when very thin sections are therein formed, resistance in these sections is significantly high. Therefore, even in an active-matrix display apparatus in which the light-emitting layers are formed individually so as to overlap a plurality of pixels, crosstalk between these pixels does not occur and display quality is improved.

It is preferable that charge injection layers be arranged for injecting holes or electrons to the light-emitting layers at a lower side of the light-emitting layers, by which the present invention is made more advantageous. In this case, the film thickness of the insulation films is preferably greater than that of the charge injection layers. Since the charge injection layers in the light-emitting devices have a resistance less than that of the light-emitting layers in the light-emitting devices, crosstalk tends to occur frequently in interpixel sections in which the light-emitting devices are formed so as to overlap. However, the above arrangement for the relation between the thicknesses of the charge injection layers and insulation films produces the step cutting 43c in the charge injection layers so that the interpixel sections are substantially insulated and crosstalk is avoided. In this way, in the present invention, when the film thickness of the insulation films is arranged to be greater than that of the light-emitting layers, avoidance of crosstalk can be ensured.

In the present invention, interpixel border regions are, for example, border regions between the pixels arranged along the data lines or the scanning lines. It is preferable that the insulation films structured as described above be formed at least in the border regions.

The interpixel border regions may also be border regions between the pixels arranged along the data lines and border regions between the pixels arranged along the scanning lines. In this case, the aforementioned insulation films are to be formed in any of the border regions. In such an arrangement, even when ink (light-emitting devices in a liquefied state) overflows from the pixels in any direction in forming the light-emitting devices in a method such as an ink-jet method, the light-emitting devices produce the step cutting in upper portions of the insulation films in the border regions between the pixels, insulating the interpixel sections.

In the present invention, it is preferable that side face sections of the insulation films be, for example, tapered so that upper portions of the side face sections protrude from a lower portion. Alternatively, the insulation films may be shaped so as to have a two-step structure including upper portions of side face sections formed to be wider than a lower portion.

In the present invention, there may be a case in which the switching circuit includes, for example, the first thin-film transistor in which the scanning signals are fed to its gate electrode and the second thin-film transistor in which its gate electrode is connected to the data line through the first thin-film transistor. In this case, the second thin-film transistor and the light-emitting device are connected in series between each of common feeder lines and each of the opposing electrodes, the common feeder lines being arranged separately from the data lines and the scanning lines.

The present invention also provides a fabrication method for an active-matrix display apparatus having pixel electrodes formed in pixels arranged in a matrix by a plurality of scanning lines and a plurality of data lines, light-emitting layers overlying the pixel electrodes, and opposing electrodes formed on the light-emitting devices, wherein the light-emitting layers emit light in response to image signals fed from the data lines via a switching circuit. The method includes a step of forming electrodes; a step of forming insulation films in regions corresponding to border portions between a plurality of the pixels, the individual insulation films having upper portions of side faces protruding from a lower portion; and a step of arranging materials of the light-emitting layers from an upper portion of the insulation films so as to overlap the regions corresponding to the border regions between the plurality of pixels.

The active-matrix light-emitting apparatus of the present invention, which may be an apparatus that controls light emitted by means of active-matrix circuits through light-emitting devices, may be used as a display apparatus and as other light control apparatuses.

BRIEF DESCRIPTION OF THE DRAWINGS

FIG. 9 is a cross-sectional view taken along the line B–B' in FIGS. 2 and 3, showing a configuration of another embodiment according to the present invention;

DETAILED DESCRIPTION OF THE PREFERRED EMBODIMENTS

Figure 12:
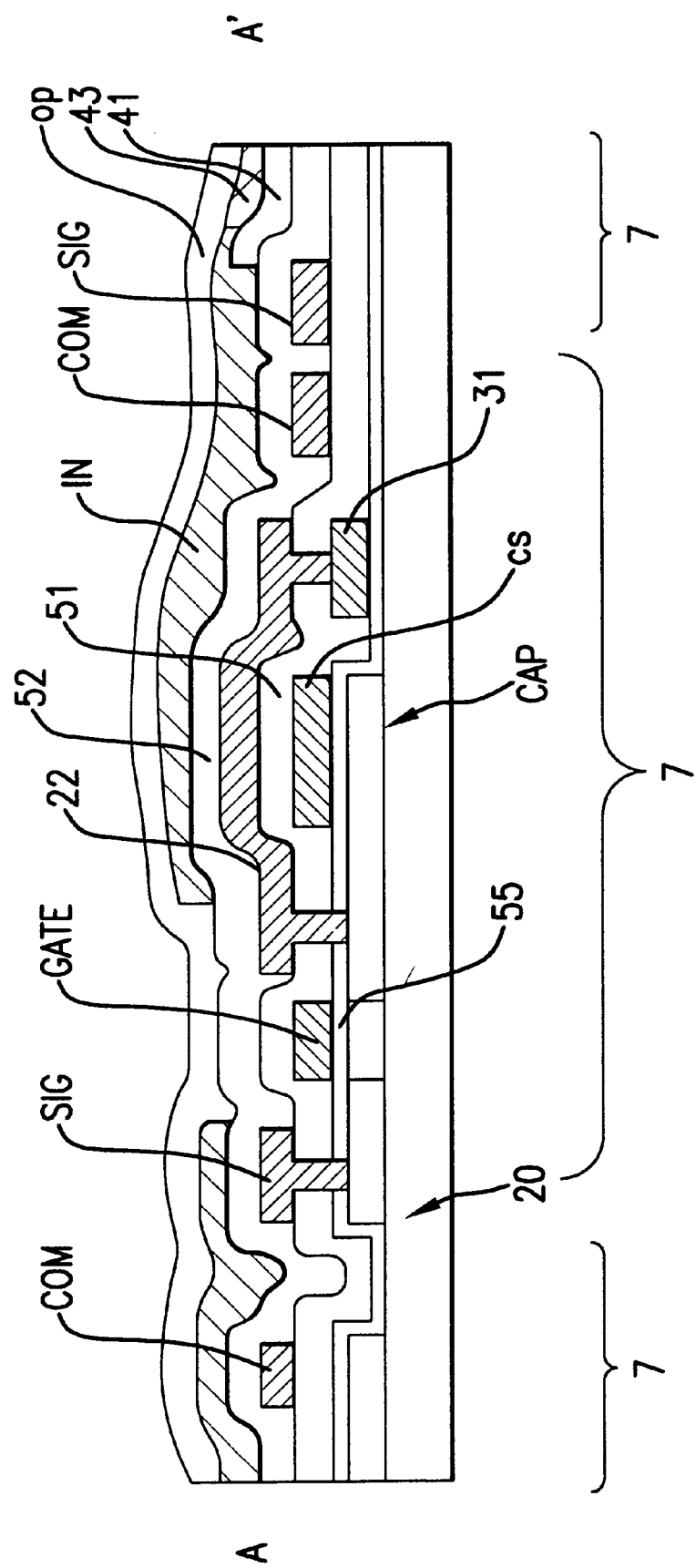
FIG. 12 is a cross-sectional view taken along the line A–A' in FIGS. 2 and 3, showing a conventional active-matrix display apparatus.
Figure 13:
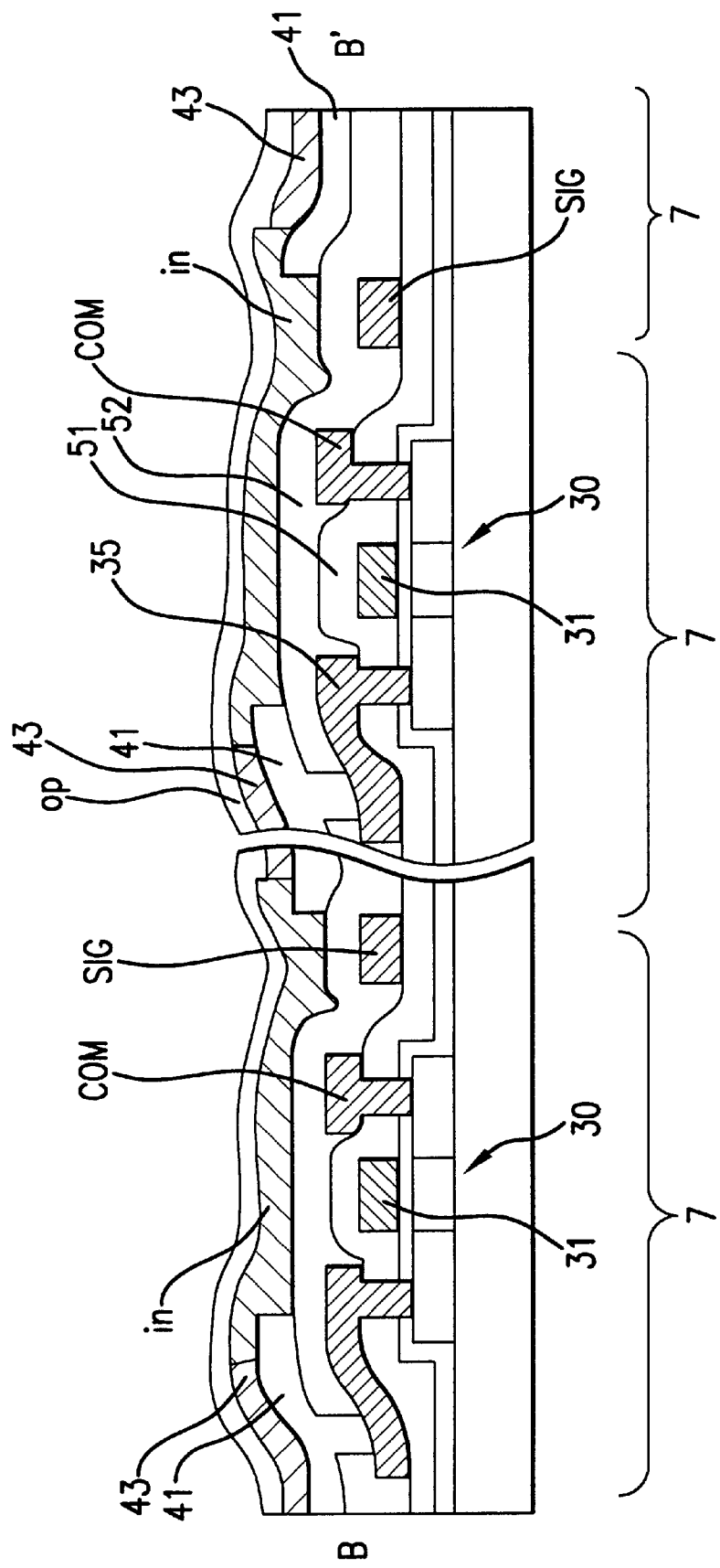
FIG. 13 is a cross-sectional view taken along the line B–B' in FIGS. 2 and 3, showing the conventional active-matrix display apparatus.
Figure 14:
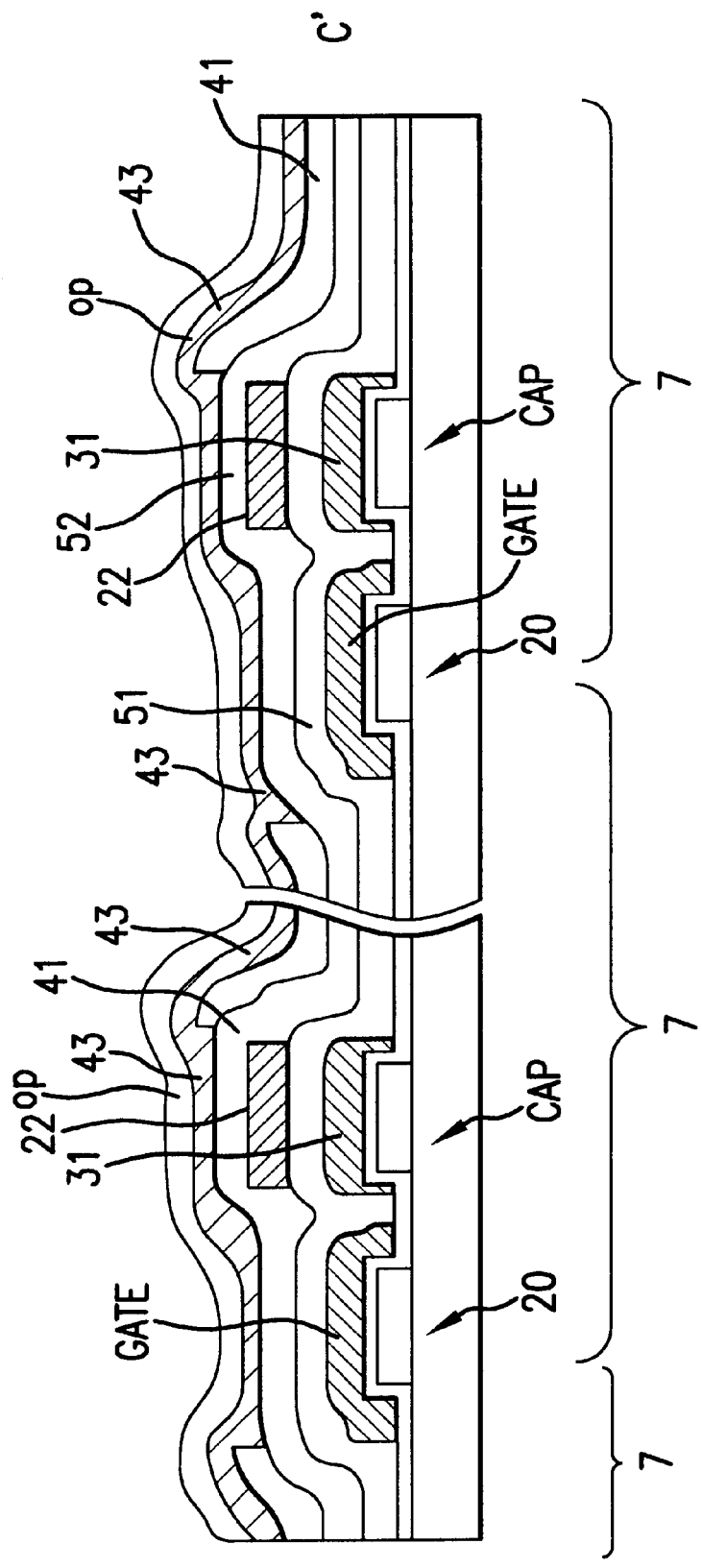
FIG. 14 is a cross-sectional view taken along the line C–C' in FIGS. 2 and 3, showing the conventional active-matrix display apparatus.

Referring to the drawings, an active-matrix display apparatus of an embodiment of the present invention is described below. For reference, the active-matrix display apparatus of this embodiment includes members common to those of the conventional active-matrix display apparatus that has been described with reference to FIGS. 12 to 14. Therefore, the description below will use the same symbols for common corresponding members.

Overall Configuration

Figure 1:
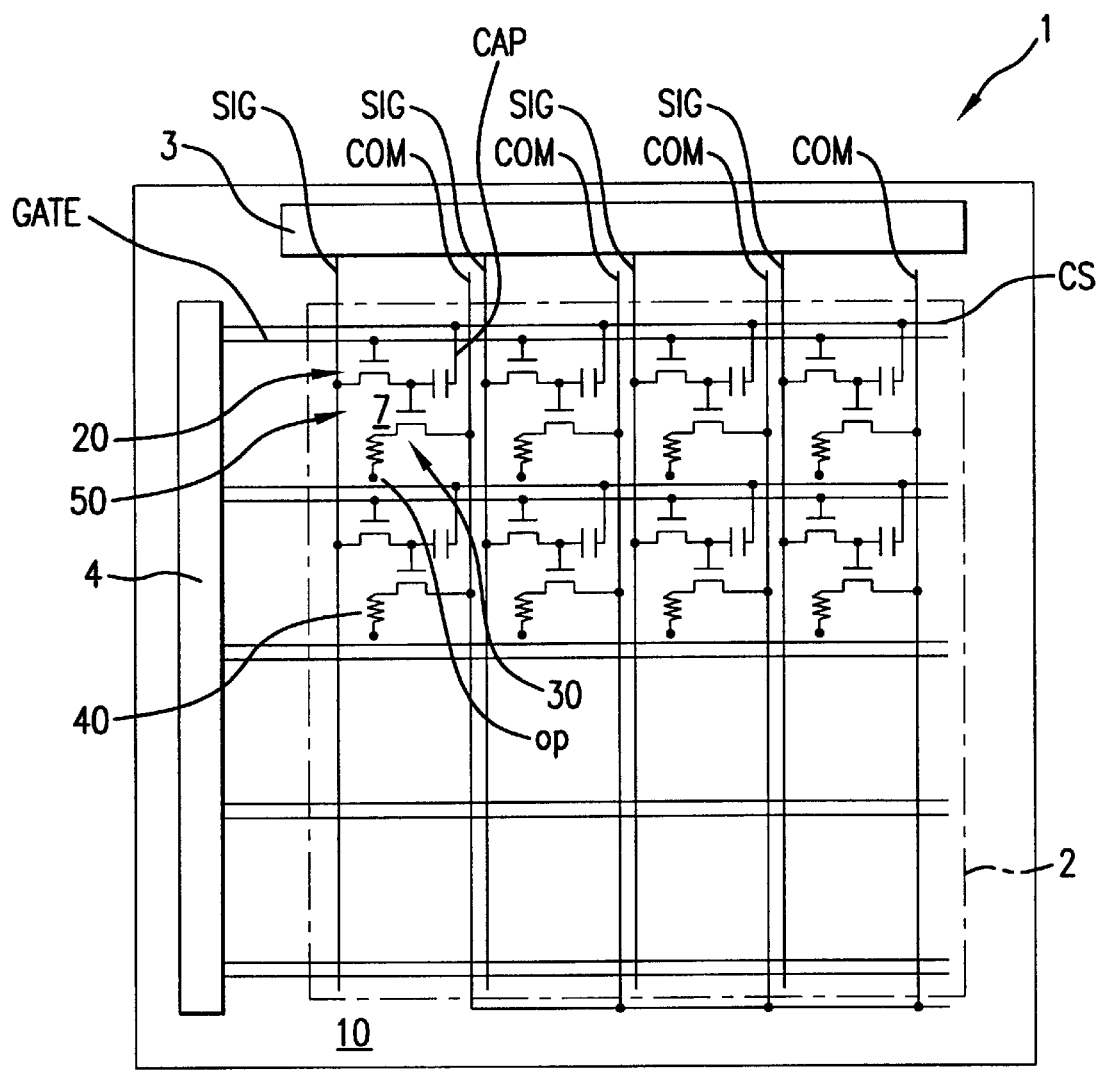
FIG. 1 is a drawing schematically showing an overall configuration of an active-matrix display apparatus.

As an embodiment of the active-matrix display apparatus of the present invention, FIG. 1 shows a drawing of a planar configuration of circuits and the like of an active-matrix display apparatus using organic thin-film EL devices of a charge injection type. As briefly described in the BACKGROUND ART regarding the configuration in this figure, an outline of a basic circuit configuration in the active-matrix display apparatus of this embodiment according to the present invention is the same as that shown in this figure.

In the active-matrix display apparatus 1 shown in this figure, a central portion of a transparent substrate 10 is a display section 2, which is a base of the apparatus. Similarly to active-matrix substrates of active-matrix display apparatuses, a plurality of pixels 7 is arranged in matrix by a plurality of scanning lines "gate" and a plurality of data lines "sig" arranged to extend perpendicular to the direction in which the scanning lines "gate" extend. In a peripheral area of the transparent substrate 10, a data side drive circuit 3 for outputting image signals is arranged at a portion where the data lines "sig" end; a scanning side drive circuit 4 for outputting scanning signals is arranged at a portion where the scanning lines "gate" end. In these drive circuits 3 and 4, complementary TFTs are composed of n-type TFTs and p-type TFTs, and the complementary TFTs compose elements such as shift register circuits, level shifter circuits, and analog switch circuits.

Each of the pixels 7 includes a switching circuit 50 to which scanning signals are fed through the scanning line "gate", and a light-emitting device 40 that emits light in response to an image signal fed from the data line "sig" through the switching circuit 50. In the illustrated example, the switching circuit 50 is configured by a first TFT 20 in which scanning signals are fed to its gate electrode through the scanning line "gate", a storage capacitor "cap" for storing image signals fed from the data line "sig" through the first TFT 20, and a second TFT 30 in which image signals stored by the storage capacitor "cap" are fed to its gate electrode. The second TFT 30 and the emitting device 43 are connected in series between an opposing electrode "op" and a common feeder "com".

In the active-matrix display apparatus 1 having the circuit configuration arranged as above, when the first TFT 20 is selected by the scanning signal and is turned on, the image signal fed from the data line "sig" is applied to a gate electrode 31 of the second TFT 30 through the first TFT 20, and concurrently, an image signal is written to the storage capacitor "cap" through the first TFT 20. As a result, when the second TFT 30 is turned on, a voltage is applied to the opposing electrode "op" and the pixel electrode 41 respectively as a negative pole and a positive pole, and a current (a driving current) applied to the light-emitting device 40 momentarily increases in a region in which the applied voltage exceeds a threshold voltage. Accordingly, the light-emitting layers 40 is allowed to emit light as an electroluminescent device or an LED device. The driving current for emitting light as described above flows through a current path composed of the light-emitting device 40, the second TFT 30, and the common feeder "com". Therefore, when the second TFT 30 is turned off, the driving current stops flowing. However, when the first TFT 20 is turned off, the storage capacitor "cap" maintains the electric potential of the gate electrode of the second TFT 30 to a potential equivalent to that of the image signal, allowing the second TFT 30 to remain turned on. Therefore, the driving current is continuously fed to the light-emitting layer 43, allowing the pixel 7 to remain illuminated. This state is maintained until new image data is written to the storage capacitor "cap" and the second TFT 30 is turned off.

Configuration of Pixel

Figure 2:
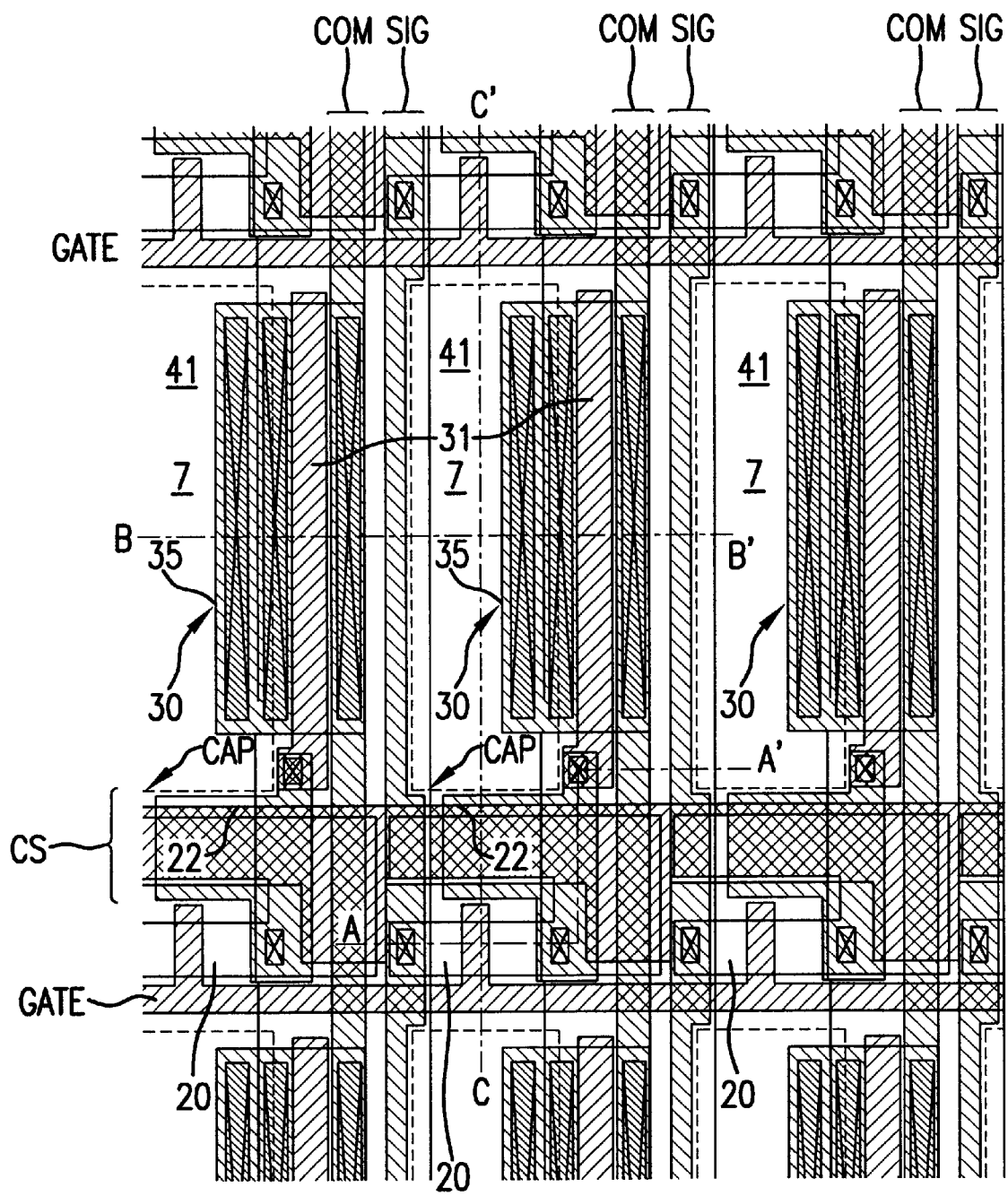
FIG. 2 is a plan view showing forming regions for conductive films composing scanning lines, capacitor lines, and the like, and for conductive films composing data lines, common feeder lines, and the like, in the active-matrix display apparatus shown in FIG. 1.
Figure 3:
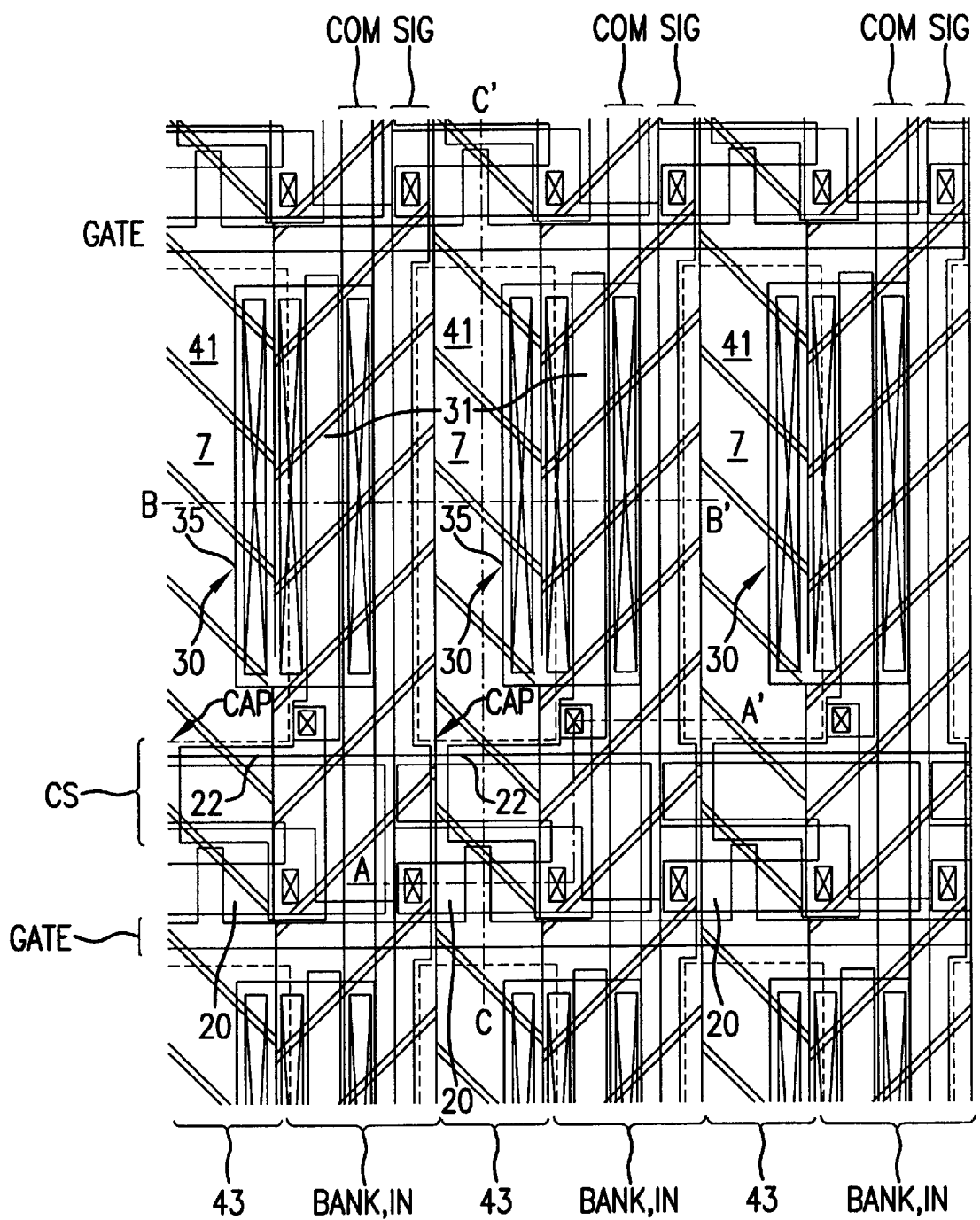
FIG. 3 is a plan view showing forming regions for insulation films formed in border regions between light-emitting devices and between pixels in the active-matrix display apparatus shown in FIG. 1.

FIGS. 2 and 3 are plan views describing a portion of the pixels shown in FIG. 1 in more detail. As is briefly described in the BACKGROUND ART regarding the planar configuration in these figures also, an outline of a circuit configuration in the active-matrix display apparatus of this embodiment according to the present invention is the same as that shown in these figures.

Figure 4:
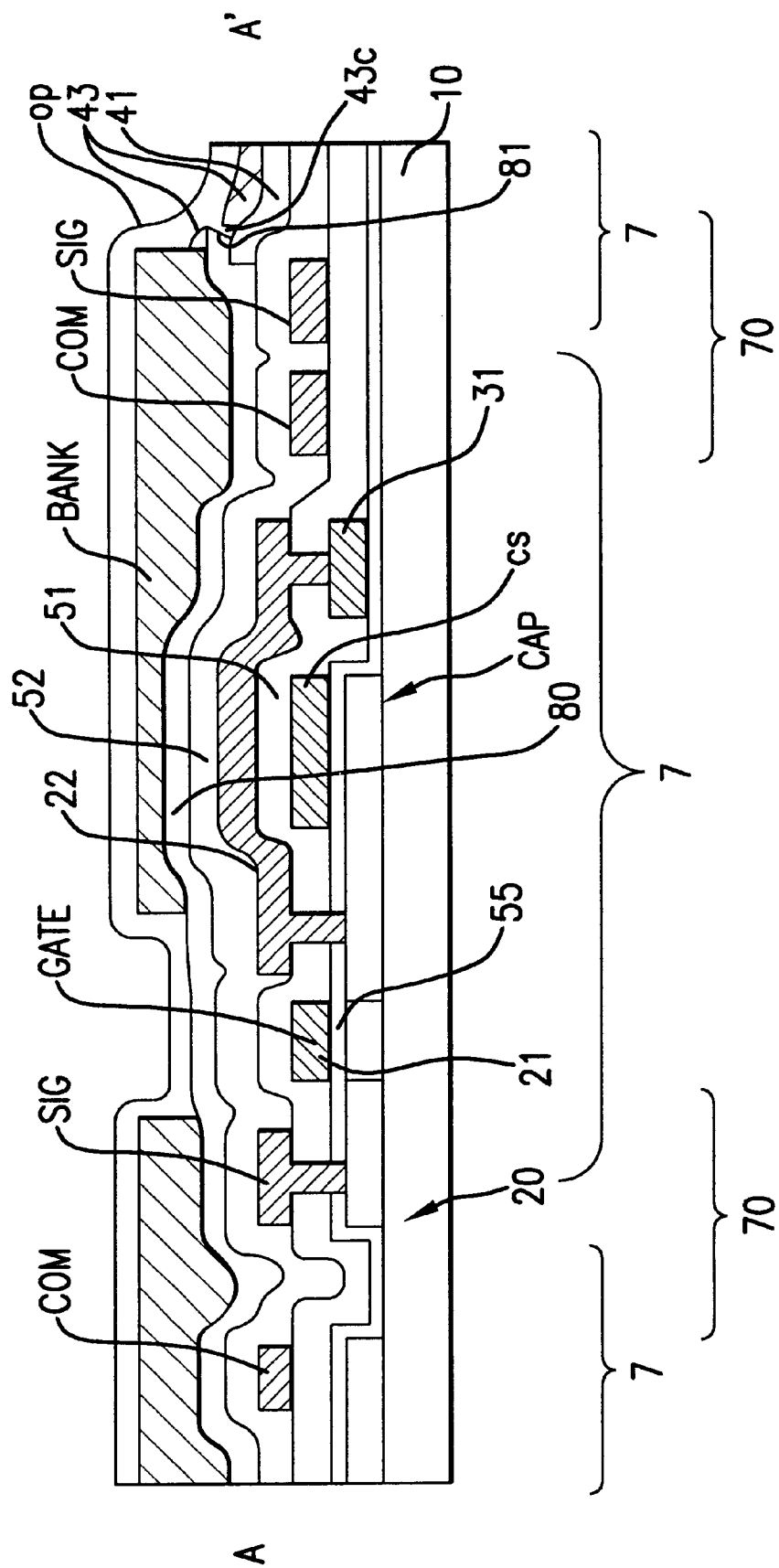
FIG. 4 is a cross-sectional view taken along the line A–A' in FIGS. 2 and 3, showing a configuration example of an active-matrix display apparatus of a first embodiment according to the present invention.
Figure 5:
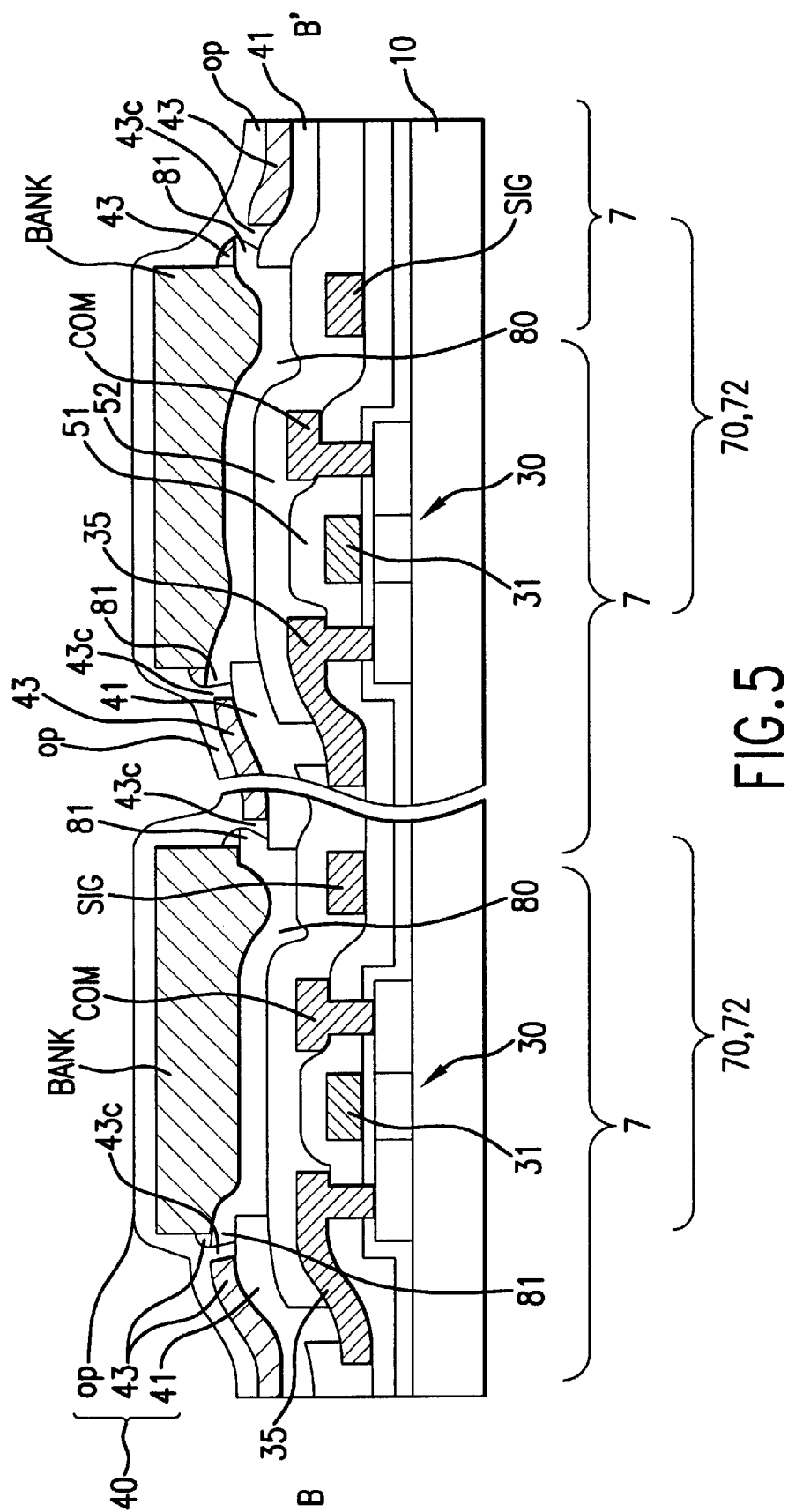
FIG. 5 is a cross-sectional view taken along the line B–B' in FIGS. 2 and 3, showing a configuration of the active-matrix display apparatus of the first embodiment according to the present invention.
Figure 6:
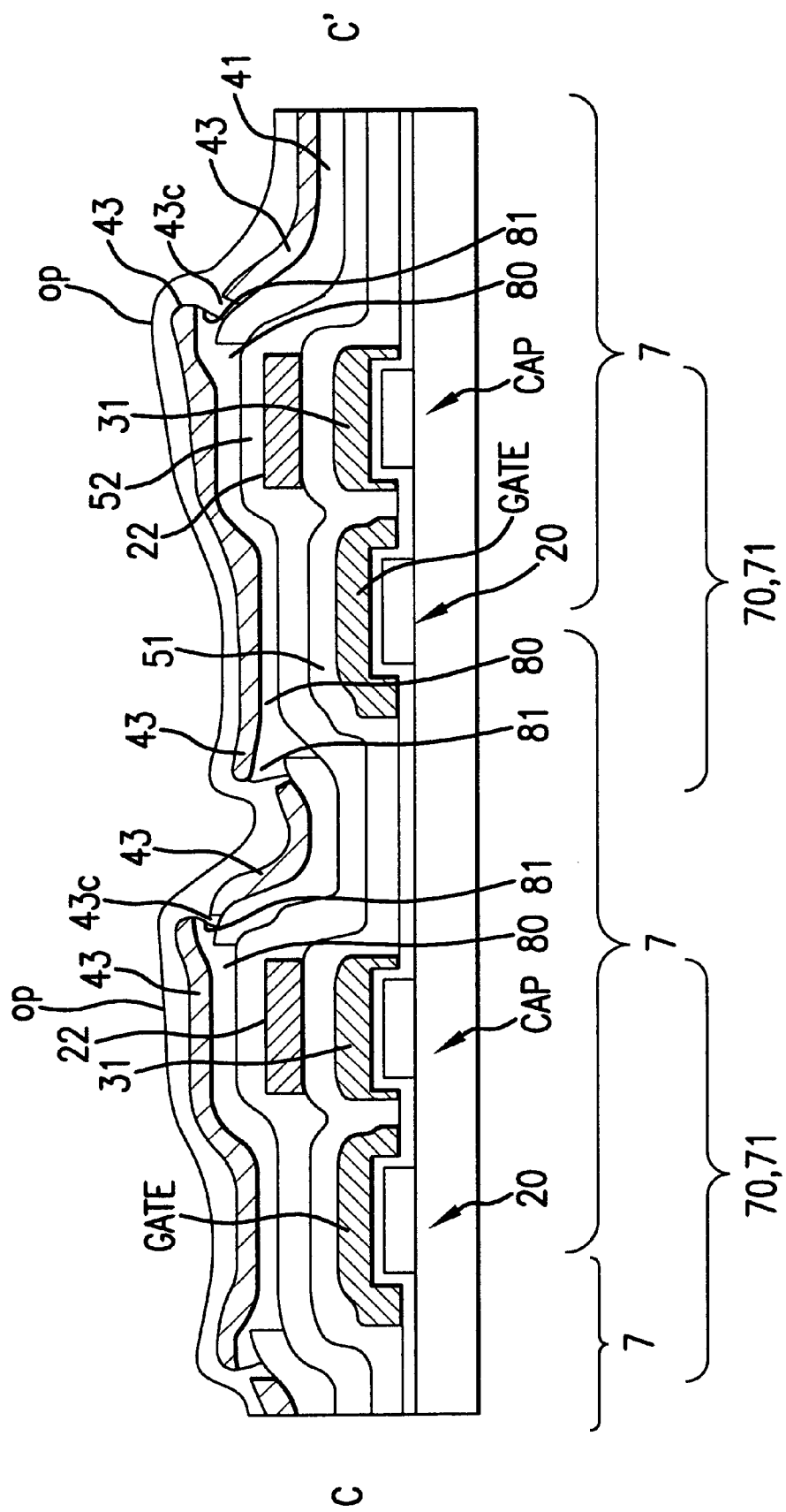
FIG. 6 is a cross-sectional view taken along the line C–C' in FIGS. 2 and 3, showing a configuration of the active-matrix display apparatus of the first embodiment according to the present invention.

Also, respective cross sections along the lines A–A', B–B', and C–C' in FIGS. 2 and 3 are shown in FIGS. 4, 5, and 6, as characteristic configurations of the active-matrix display apparatus 1 of the present invention.

In FIGS. 2 and 3, in any pixel of the active matrix display device 1, the first TFT 20 and the second TFT 30 that are composed of island-shaped semiconductor films are formed.

As can be seen from FIGS. 2, 3, and 4, a gate electrode 21 is formed as a part of the scanning line "gate" in the first TFT 20. In the first TFT 20, the data line "sig" is electrically connected to a source region through a contact hole in a first interlayer insulation film 51, and a storage electrode 22 is electrically connected to a drain region. The storage electrode 22 is arranged to extend toward a region in which the second TFT 30 is formed, and the gate electrode 31 of the second TFT 30 is electrically connected to the foregoing extension section through a contact hole in the first interlayer insulation film 51. A capacitor line "cs" is formed in a side position of the scanning line "gate". This capacitor line "cs" is commonly positioned for the drain region of the first TFT 20 and the storage electrode 22 via the first interlayer insulation film 51 and a gate insulation film 55, composing the storage capacitor "cap".

As can be seen from FIGS. 2, 3, and 5, a junction electrode 35 is electrically connected to either one of the source and drain regions of the second TFT 30 through a contact hole in the first interlayer insulation film 51, and the pixel electrode 41 is electrically connected to the junction electrode 35 through a contact hole in a second interlayer insulation film 52. The common feeder line "com" is electrically connected to the other of the source and drain regions of the second TFT 30 through the contact hole in the first interlayer insulation film 51.

The pixel electrodes 41 are independently formed for the individual pixels 7. An upper portion of the pixel electrode 41 is layered with organic materials in the order of the light-emitting layers 43 composed of polyphenylene vinylene (PPV) or the like and an opposing electrode "op" composed of a metal film such as aluminum alloy or calcium alloy which contains an alkali metal such as lithium, the opposing electrode "op" being formed so as to cover the entire surface of the display section 2.

In the illustrated example, a thick insulation film "bank" is formed in a region in which the data line "sig" and the common feeder line "com" extend so that the light-emitting devices 40 (the light-emitting layers 43) of the pixels 7 positioned at both sides of the data line "sig" and the common feeder line "com" are insulated from each other.

As can be seen from FIGS. 2, 3, and 6, however, the insulation film "bank" is not formed between the pixels 7 arranged along the common feeder line "com". In this direction, the light-emitting layers 43 are formed in a stripe so as to overlap a plurality of the pixels 7. Therefore, if such an arrangement is so implemented, crosstalk might occur because of conductivity of the light-emitting devices 40 (the light-emitting layers 43) between the pixels 7 arranged along the common feeder line "com".

Figure 7A:
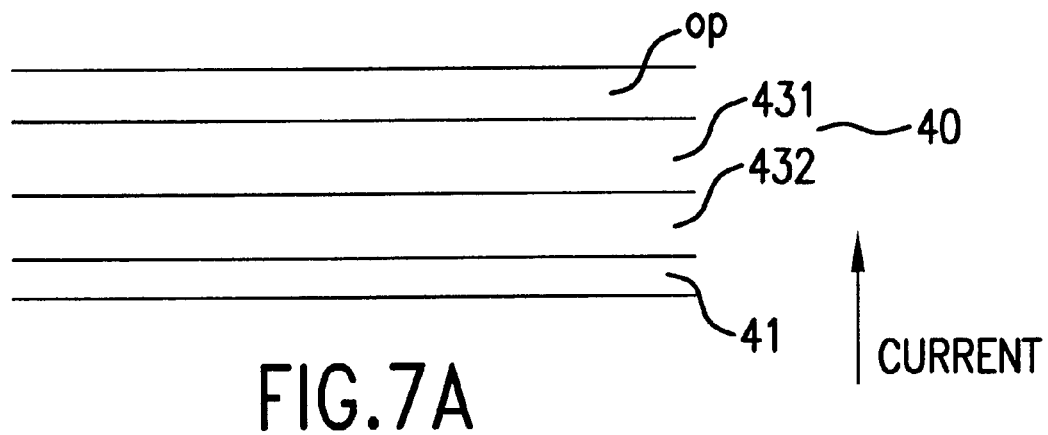
FIGS. 7(A) and 7(B) are cross-sectional views of a configuration of a light-emitting device.

Particularly, in this embodiment, as shown in FIG. 7(A), although the pixel electrodes 41 are independent of each other for the individual pixels 7, a hole injection layer 432 is formed as a charge injection layer below a light-emitting layer 431 having a film thickness ranging from 0.05 to 0.3 μm in the light-emitting layers 43 arranged so as to overlap a plurality of the pixels 7. The hole injection layer functions as the charge injection layer having the film thickness ranging from 0.01 to 0.1 μm, which is thinner than that of the light-emitting layer 431, but which has less resistance. Therefore, although light-emitting efficiency (ratio of hole injection to the light-emitting layer 431) is improved by the formation of the hole injection layer 432, crosstalk is apt to occur between the pixels on which the light-emitting layer 43 is formed so as to overlap.

Crosstalk Countermeasure

In this embodiment, as shown in FIG. 6, in each border region 71 (between the pixels arranged along the data line "sig" and the common feeder line "com") in which the light-emitting layer 43 is arranged so as to overlap in a border region between the individual pixels 7, there is formed a step-cutting insulation film 80 between the pixel electrode 41 and the light-emitting layer 43, the insulation film having side face sections with upper portions protruding from lower sections as overhang sections 81. In this, it is preferable that the step-cutting insulation film 80 have at least a film thickness greater than that of the light-emitting layer 43 and greater than that of the hole injection layer 432 when it is formed. In this embodiment, the film thickness of the step-cutting insulation film 80 is predetermined so as to be greater than that of the light-emitting layer 43.

Accordingly, in the active-matrix display apparatus 1 of this embodiment, after the step-cutting insulation film 80 having the overhang sections 81 (upper portions) at the side face sections is formed, the light-emitting layers 43 are formed on an upper side thereof. Therefore, the light-emitting layers 43 produce step cutting 43c at the overhang sections 81 to be insulated from each other between adjacent pixels. For this reason, even with the light-emitting layers 43 formed so as to overlap the border region 71 between the pixels 7, the light-emitting devices 40 thereby obtained are substantially arranged to be insulated by the step cutting 43c. Even if the step cutting 43c is not completely produced in the light-emitting layer 43, when a very thin section is formed, this section sharply increases the resistance. Therefore, even in the active-matrix display apparatus 1 in which the individual light-emitting layers 43 of the light-emitting devices 40 are formed individually so as to overlap a plurality of the pixels, crosstalk does not substantially occur between the interpixel sections, and higher display quality is allowed.

For reference, as shown in FIGS. 4 and 5, in the border region 72 in which the data line "sig" and the common feeder line "com" extend in the border region 70 between the individual pixels 7, the light-emitting layers 43 are insulated by the thick insulation film "bank". However, the step-cutting insulation film 80 in which the upper portions of the side face sections protrude from the lower section as the overhang sections 81 is also formed at a lower side of the thick insulation film "bank" (at an interlayer portion between the pixel electrode 41 and the light-emitting layer 43). Therefore, in this portion also, the step cutting 43c occurs at the overhang sections 81 in the light-emitting layers 43 formed on the upper side of the step-cutting insulation film 80, causing them to be separated toward a scanning line "gate".

(Fabrication Method for the Active-Matrix Display Apparatus 1)

A fabrication method for the active-matrix display apparatus 1 arranged as above is described.

In the fabrication method for the active-matrix display apparatus 1, fabrication steps up to the fabrication of the first TFT 20 and the second TFT 30 on the transparent substrate 10 can be implemented according to fabrication steps for an active-matrix substrate of an liquid-crystal active-matrix display apparatus 1. Therefore, only an outline is given below with reference to FIGS. 4, 5, and 6. For reference, in this embodiment, the thick insulation films "bank" are formed in the border regions 72 in which the data lines "sig" and the common feeder lines "com" extend. In the above, liquid material (discharged liquid) discharged from an ink-jet head is blocked by the thick insulation films "bank". Concurrently, the light-emitting layers 43 are automatically insulated by the step-cutting insulation films 80 in interpixel areas in which the pixels 7 are arranged along the data lines "sig" and the common feeder line "com". For this reason, for improving productivity, this embodiment employs an ink-jet method so as to form the light-emitting layers 43 in a stripe from liquid material (discharged liquid) injected from an ink-jet head.

First, processing is performed on the transparent substrate 10, as follows. Depending upon requirements, a base-protection film (not shown) composed of a silicon oxide film having a thickness of about 2,000 to 5,000 angstroms is first formed by a plasma CVD method using a source gas, such as TEOS (tetraethoxysilane) or an oxygen gas. Then, on the surface of the base-protection film, a semiconductor film composed of an amorphous silicon film having a thickness of about 300 to 700 angstroms is formed by the plasma CVD method. Next, the semiconductor film composed of the amorphous silicon film is subjected to a crystallization step, such as laser-annealing or solid-phase epitaxy method, to crystallize the semiconductor film into a polysilicon film.

The semiconductor film is then formed by patterning into an island-shaped semiconductor film. Then, the gate insulation film 55 is formed on the surface of the semiconductor film composed of a silicon oxide film or a nitride film having a thickness of approximately 600 to 1,500 angstroms by the plasma CVD method using the source gas, such as TEOS (tetraethoxysilane) or an oxygen gas.

Next, a conductive film composed of a metal film, such as aluminum, tantalum, molybdenum, titanium, or tungsten, is formed by sputtering and is then formed by patterning into the scanning line "gate", the capacitor line "cs", and the gate electrode 31.

In the above state, source and drain regions are formed in a self-aligned manner with respect to the scanning line "gate", the gate electrode 31, and the like, by implanting highly concentrated phosphorus ions. A portion in which impurities are not introduced is used as a channel region.

Next, after the first interlayer insulation film 51 is formed, the individual contact holes are formed. Then, the data line "sig", a storage electrode 22, the common feeder line "com", and the junction electrode 35 are formed. This results in formation of the first TFT 20, the second TFT 30, and the like.

Next, the second interlayer insulation film 52 is formed, and a contact hole is formed in the interlayer insulation film at a portion corresponding to the junction electrode 35. Then, after an ITO film is formed entirely on the surface of the second interlayer insulation film 52, patterning is performed in a manner such as photolithography or the like to shape in the pixel therein for improving productivity. Then, the pixel electrode 41 that is to be electrically connected to the source/drain region of the second TFT 30 through the contact hole is formed for each pixel 7.

After the above TFT is formed, the step-cutting insulation film 80 having the overhang sections 81 at side face sections (upper portions protruding toward the sides) is formed at an upper side of the pixel electrode 41.

Figure 8A:
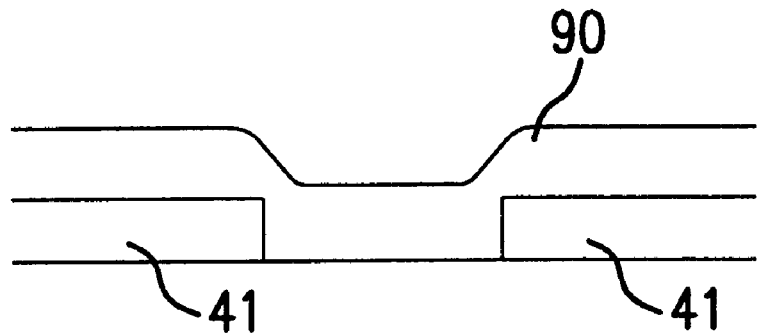
FIGS. 8(A) to 8(C) are cross-sectional views illustrating an example of forming step-cutting insulation films along with the process therefor in a method of fabricating an active-matrix display apparatus according to an embodiment of the present invention.
Figure 8B:
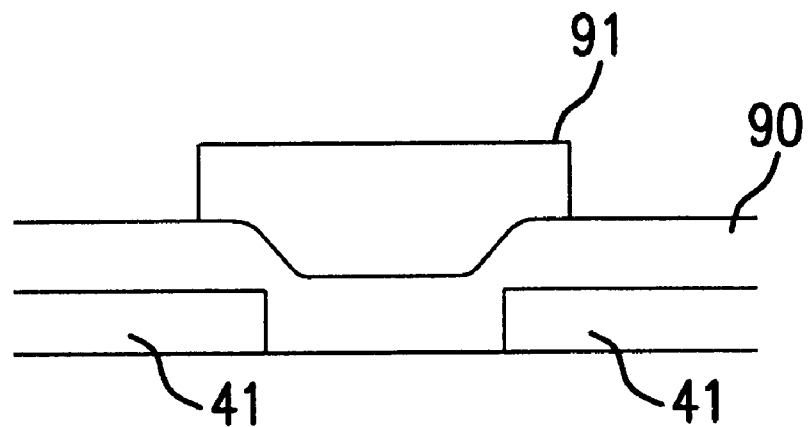

For the above, as shown in FIG. 8(A), after a silicon oxide film 90 is formed by the CVD method, a resist mask 91 is formed, as shown in FIG. 8(B). At this time, the post-baking temperature for a photoresist, which is to be normally set at 130 to 150° C., is set at a higher temperature of 160 to 170° C. to strengthen the adhesion between the silicon oxide film 90 and the resist mask 91. After the above, wet etching using a hydrofluoric acid etchant is applied to the silicon oxide film 90 via the resist mask 91. For reference, adhesion between the silicon oxide film 90 and the resist mask 91 is high, but adhesion between the silicon oxide film 90 and the pixel electrode 41 composed of the ITO film is low. Therefore, side-etching due to etchant penetration progresses at a border face between the silicon oxide film 90 and the pixel electrode 41. As a result, the silicon oxide film 90 is formed to be the step-cutting insulation film 80 having a reversed tapered structure in which upper portions of side face sections projecting from a lower portion as the overhang sections 81. That is, the insulation film 80 is obtained in a desired shape by causing the side-etching of the silicon oxide to progress in the arrangement in which the adhesion between the resist mask and the silicon oxide as the insulation film becomes higher than the adhesion between the silicon oxide and the pixel electrode as the base.

Next, after a resist is formed on the surface of the step-cutting insulation film 80, the resist is subjected to patterning so as to remain along the scanning line "gate" and the data line "sig" to form the wide and thick insulation film "bank".

Next, the light-emitting layer 43 is accumulated by use of the ink-jet method in the striped region delimited by the insulation films "bank" to form the light-emitting device. For this, liquid material (precursor) as the light-emitting layer 43 for composing the light-emitting device 40 is discharged from the ink-jet head to an interior region of the insulation films "bank", and is fixed in the interior region of the insulation films "bank" to produce the light-emitting layer 43. For reference, the insulation film "bank" is water repellent because it is composed of the resist. In contrast, the precursor of the light-emitting layers 43 uses a hydrophilic solvent, and the region in which the light-emitting layers 43 is applied is surely defined by the insulation films "bank". In addition, the light-emitting layer 43 is automatically insulated by the step-cutting insulation film 80 in the border region 71 in which the pixels are arranged so as to be along the data line "sig" and the common feeder line "com". For reference, the above is the same as in forming the light-emitting layers 43 by using a coating method instead of the ink-jet method.

Then, the opposing electrode "op" is formed substantially over the entire surface of the transparent substrate 10, by which the light-emitting device 40 is completed.

The TFTs are also formed in the data side drive circuit 3 and the scanning side drive circuit 4 shown in FIG. 1, however, these TFTs are formed by complete or partial repetition of the steps for forming the TFTs for the pixels 7 described above. Accordingly, the TFTs composing the drive circuits can be formed between the same layers as those of the TFTs of the pixels 7. Regarding the first TFT 20 and the second TFT 30, both may be of the n-type or p-type, or one may be of the n-type and the other may be of the p-type. In any combination, the TFTs can be formed in the known manner.

According to the active-matrix display apparatus produced in the fabrication method described above, the thick insulation film "bank" is formed along the data line "sig"; accordingly, the thick insulation film "bank" and the second interlayer insulation film 52 are interposed between the data lines "sig" and the opposing electrodes "op". Therefore, parasitic capacitance of data line "sig" is very small, so that a load being exerted on the drive circuits can be reduced, allowing achievement of lower power consumption or a higher speed of display operations. In addition, when insulation films "bank" are formed by black resists, they function as a black matrix, improving display quality in terms of contrast and the like. That is, in the active-matrix display apparatus 1 according to this embodiment, since the opposing electrodes "op" are formed entirely over the pixels 7 on the surface of the transparent substrate 10, light reflected by the opposing electrodes "op" reduces the contrast. For this reason, when the insulation films "bank" that are to function so as to avoid parasitic capacitance are formed by the black resists that also function as the black matrix, reflected light from the opposing electrode "op" is blocked. This improves the contrast. For reference, the thick insulation films "bank" can be easily formed when they are composed of an organic material, such as a resist film or a polyimide film. When the insulation films "bank" are composed of an inorganic material, such as a silicon oxide film or a silicon nitride film, deposited by the CVD method or an SOG method, deterioration of the light-emitting layers 43 can be avoided even in a state where the insulation films "bank" contact the light-emitting layers 43.

Other Embodiments

There is also a case in which border regions in which individual light-emitting devices (light-emitting layers) are arranged so as to overlap a plurality of pixels 7 are border regions in which the pixels 7 are arranged along scanning lines "gate". In such a case, step-cutting insulation films 80, as described above, are to be formed for the border regions in which the pixels 7 are arranged along the scanning lines "gate".

In the embodiment described above, also in the border region 72 in which the data line "sig" and the common feeder line "com" extend in the border region 70 of each of the pixel 7, the step-cutting insulation film 80 is formed at the lower side of the thick insulation film "bank". However, the thick insulation film "bank" substantially insulates the light-emitting device. Therefore, the step-cutting insulation film 80 thereat may be omitted.

On the other hand, step-cutting effects of the insulation films 80 may be positively used also in the border regions 72 in which a data line "sig" and a common feeder line "com" extend. That is, as in FIG. 9 showing a cross-sectional view equivalent to the view taken along the line B–B' in FIGS. 2 and 3, while the step-cutting insulation films 80 having overhang sections 81 are also formed in the border regions 72 in which the data line "sig" and the common feeder line "com" extend, formation of the insulation film "bank" is omitted. That is, after the step-cutting insulation film 80 is formed so as to surround the pixel 7, a light-emitting layer 43 is then formed to obtain a light-emitting device 40. As a result, step cutting 43c occurs at the overhang sections 81 of the step-cutting insulation film 80 in the light-emitting layers 43 on an entire periphery of the pixel 7, allowing independent production of the light-emitting layers 43 for each of the pixels 7.

Figure 8C:
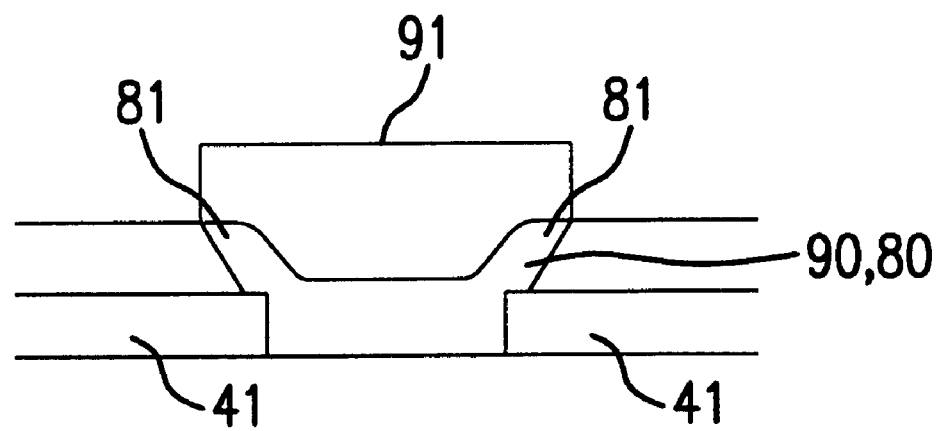

As a forming method for the step-cutting insulation films 80, in addition to the method described with reference to FIG. 8, a method described below may be used.

Figure 10A:
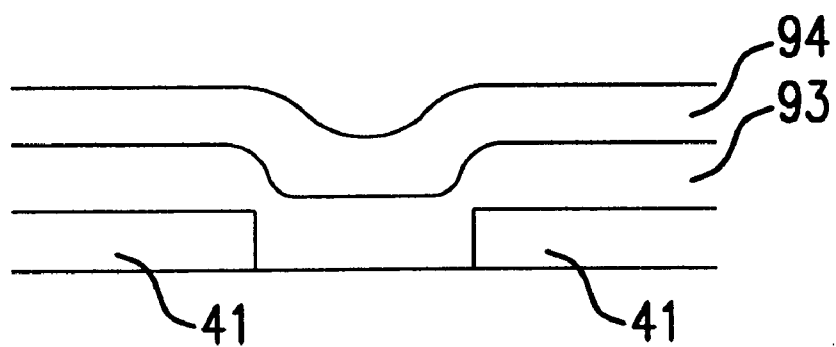
FIGS. 10(A) to 10(C) are cross-sectional views illustrating another example of forming the step-cutting insulation films along with the process therefor in a method of fabricating an active-matrix display apparatus according to an embodiment of the present invention.
Figure 10B:
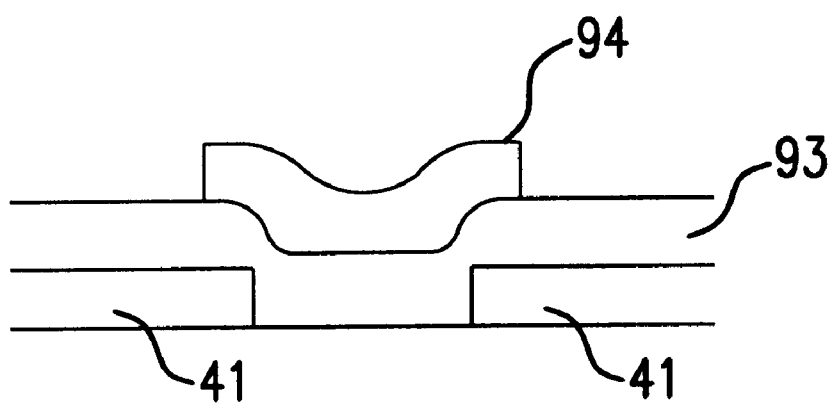
Figure 10C:
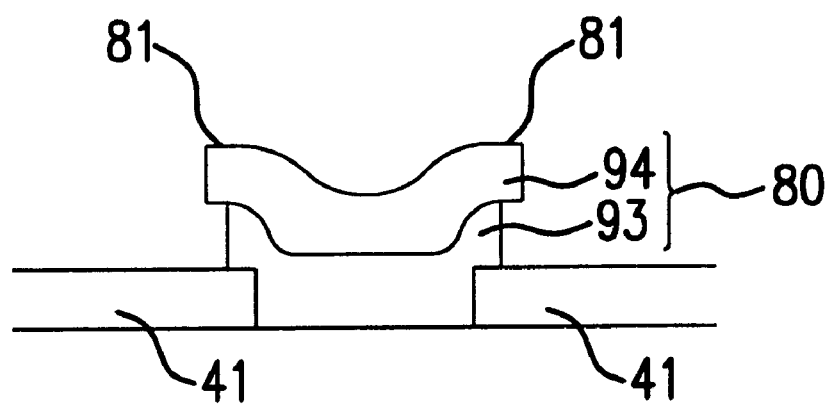

First, as shown in FIG. 10(A), a silicon oxide film 93 and a silicon nitride film 94 are sequentially overlaid on the surface side of the pixel electrode 41. Thereafter, as shown in FIG. 10(B), the silicon nitride film 94 is subjected to patterning using a photolithographic technique, and the silicon oxide film 93 is then subjected to patterning using the silicon nitride film 94 as a mask. At this stage, conditions and the like of individual etching processes for the silicon oxide film 93 and the silicon nitride film 94 are adjusted. In this way, as shown in FIG. 10(C), a two-step structure of the step-cutting insulation film 80 can be formed by the silicon oxide film 93 (a lower portion) of which the width is reduced by side-etching, and the silicon nitride film 94 (upper portions protruding toward sides from lower portions) remains so as to be wider than the silicon oxide film 93 as the overhang sections 81.

Figure 11A:
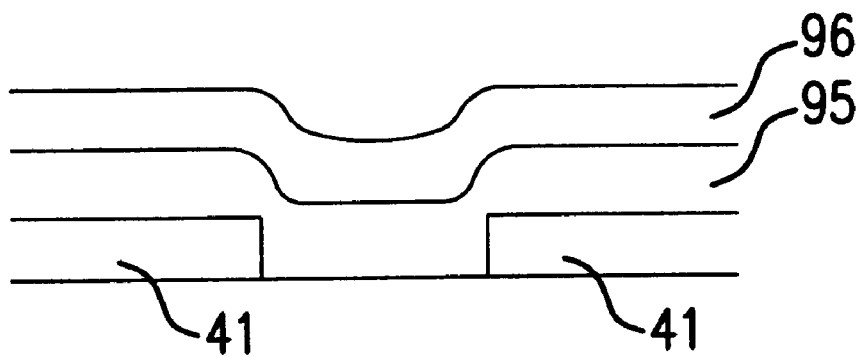
FIGS. 11(A) to 11(C) are cross-sectional views illustrating still another example of forming the step-cutting insulation films along with the process therefor in a method of fabricating an active-matrix display apparatus according to an embodiment of the present invention.
Figure 11B:
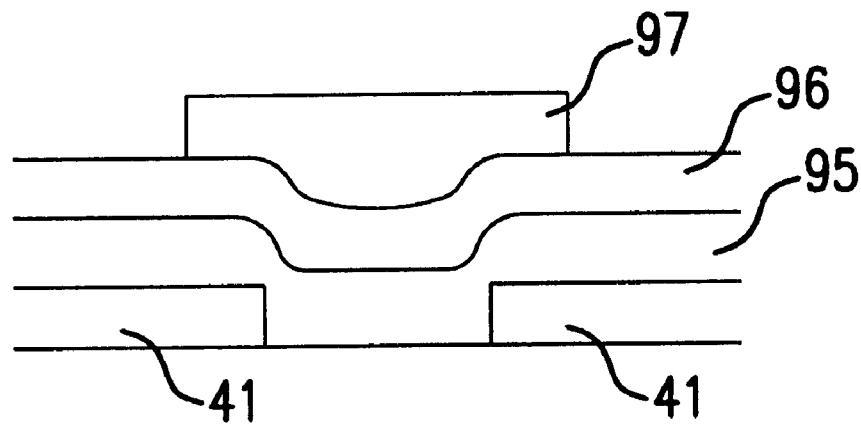
Figure 11C:
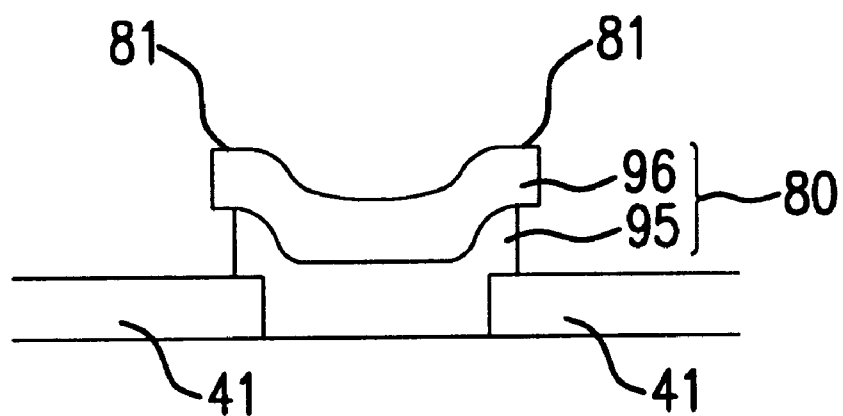

Alternatively, as shown in FIG. 11(A), after spin-coating is performed to form an SOG-silicon oxide film 95, the CVD method is sequentially applied to form a CVD-silicon nitride film 96. After the above, the SOG-silicon oxide film 95 and the CVD-silicon nitride film 96 are etched in a batch via a resist mask 97 formed, as shown in FIG. 11(B). As a result, side-etching progresses in the SOG-silicon oxide film 95 allowing high-speed etching, and as shown in FIG. 11(C), a two-step structure of the step-cutting insulation film 80 can be formed by the SOG-silicon oxide film 95 (a lower portion) of which the width is reduced by side-etching, and the CVD-silicon nitride film 96 remains to be wider than the SOG-silicon oxide film 95 as the overhang sections 81 (upper portions protruding toward the sides from lower portions).

Figure 7B:
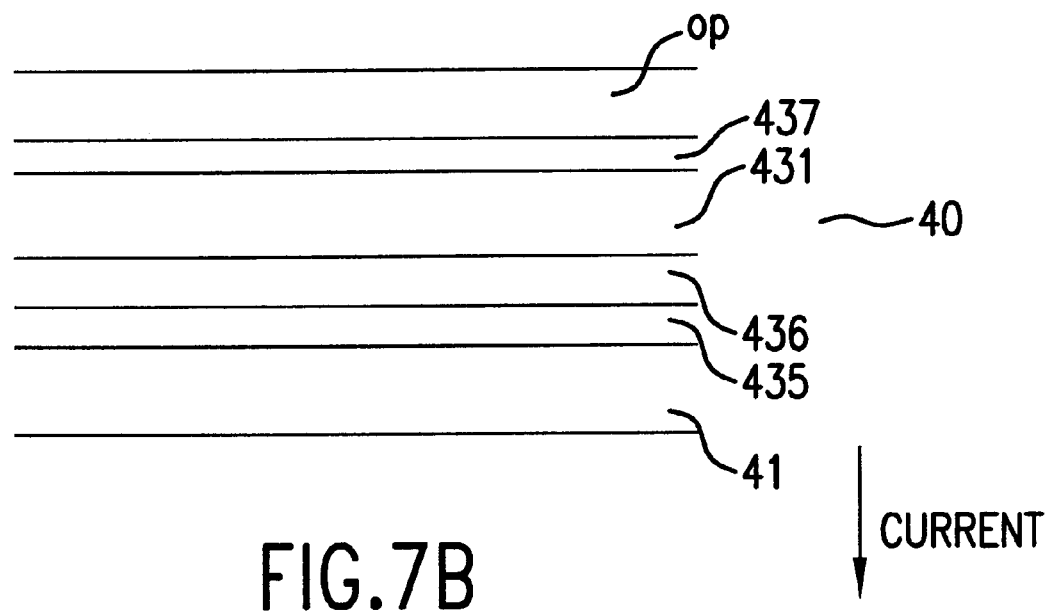

In the light-emitting device 40 shown in FIG. 7(A), the hole injection layer 432 and the light-emitting layer 431 are overlaid on the surface of the pixel electrode 41 composed of the ITO film, and the opposing electrode "op" composed of a metal film such as lithium-containing aluminum or calcium is formed on the surface of the light-emitting layer 43. To arrange the drive current so as to flow in the direction opposite to that in the light-emitting device shown in FIG. 7(A), however, as shown in FIG. 7(B), from a lower side to an upper side, the following elements may be overlaid in the listed order. They are a pixel electrode 41 made of an ITO film, a lithium-containing aluminum 435 that is thin so as to be transparent, an electron injection layer 436 (charge injection layer), an organic semiconductor layer 431, an ITO film 437, and an opposing electrode "op".

As described above, the active-matrix light-emitting apparatus of the present invention, particularly, the active-matrix display apparatus of the present invention, has step-cutting insulation films in each of which upper portions protrude toward sides from a lower portion as overhang sections in a lower side of the light-emitting devices in border regions in which light-emitting devices (light-emitting layers) are individually arranged on an upper portion so as to overlap in the border regions of pixels, particularly, in fabrication stages. Therefore, step-cutting is caused in the light-emitting layers formed over the foregoing insulation films, even light-emitting layers formed individually so as to overlap, interpixel sections can be substantially insulated for each pixel. Even when complete step-cutting does not occur in the light-emitting layers, but when very thin sections are formed therein, the resistance in these sections increases sharply. Therefore, even in an active-matrix display apparatus in which light-emitting layers of light-emitting devices are formed individually so as to overlap a plurality of pixels, crosstalk between these pixels can be avoided, improving display quality.

INDUSTRIAL APPLICABILITY

The active-matrix light-emitting apparatus of the present invention may be used as a display apparatus in which crosstalk is avoided so as to provide high-quality images. The light-emitting apparatus may be suitably applied to electronic devices requiring high-quality image display, including laptop personal computers (pcs), television sets, viewfinder-type or monitor-direct-vision-type videotape recorders, vehicle navigation systems, electronic notebooks, calculators, wordprocessors, engineering workstations (EWSs), portable telephones, videophone sets, POS terminals, pagers, and devices having touch panels.

What is claimed is:

1. An active-matrix light-emitting apparatus having pixel electrodes formed in pixels arranged in a matrix by a plurality of scanning lines and a plurality of data lines, light-emitting layers overlying the pixel electrodes, and opposing electrodes formed on light-emitting devices, the light-emitting devices composed of the light-emitting layers emitting light in response to image signals fed from the data lines via switching devices, the active-matrix light-emitting apparatus comprising:

insulation films provided between the pixel electrodes and the light-emitting layers, each insulation film having upper portions at side face sections protruding from a lower portion in border regions between a plurality of pixels.

2. The active-matrix light-emitting apparatus according to claim 1, the insulation films and the light-emitting layers having a film thickness and the film thickness of the insulation films being greater than the film thickness of the light-emitting layers.

3. The active-matrix light-emitting apparatus according to claim 1, further comprising charge injection layers that inject holes or electrons to the light-emitting layers at a lower side of the light-emitting layers.

4. The active-matrix light-emitting apparatus according to claim 3, the insulation films and the charge injection layers having a film thickness and the film thickness of the insulation films being greater than the film thickness of the charge injection layers.

5. The active-matrix light-emitting apparatus according to claim 1, the light-emitting layers being arranged so as to be substantially insulated in border regions between adjacent pixels.

6. The active-matrix light-emitting apparatus according to claim 1, the light-emitting layers being arranged so as to be apart from each other in border regions between adjacent pixels.

7. The active-matrix light-emitting apparatus according to claim 1, the light-emitting layers being arranged in a small thickness so that resistance in border regions between adjacent pixels is less than that on the pixel electrodes.

8. The active-matrix light-emitting apparatus according to claim 1, the border regions between the pixels being border regions between pixels arranged along the data lines or the scanning lines, the insulation films being formed in the border regions.

9. The active-matrix light-emitting apparatus according to claim 1, the border regions between the pixels being border regions between pixels arranged along the data lines and the scanning lines, the insulation films for step-cutting being formed in any of the border regions.

10. The active-matrix light-emitting apparatus according to claim 1, the insulation film comprising side face sections tapered so that upper portions of the side face sections protrude from a lower portion.

11. The active-matrix light-emitting apparatus according to claim 1, the insulation films each comprising a two-step structure, the two-step structure comprising a narrow lower portion and an upper portion formed to be wider than the lower portion so that upper portions at side face sections protrude from the lower portion.

12. An active-matrix light-emitting apparatus according to claim 1, each of the switching devices comprising:

a first thin-film transistor having a first gate electrode, the scanning signals being fed to the first gate electrode and a second thin-film transistor having a second gate electrode, the second gate electrode being connected to a data line through the first thin-film transistor, the second thin-film transistor and a light-emitting device being connected in series between each of common feeder lines and each of the opposing electrodes, the common feeder lines being arranged separately from the data lines and the scanning lines.

13. The active-matrix light-emitting apparatus according to claim 12, comprising an active-matrix display apparatus.

14. A fabrication method for an active-matrix light-emitting apparatus having pixel electrodes formed in pixels arranged in a matrix by a plurality of scanning lines and a plurality of data lines, light-emitting layers overlying the pixel electrodes, and opposing electrodes formed on the light-emitting devices, the light-emitting layers emitting light in response to image signals fed from the data lines via switching devices, the method comprising:

forming the pixel electrodes;

forming insulation films in regions corresponding to border portions between a plurality of the pixels, each insulation film having upper portions of side faces protruding from a lower portion; and arranging materials of the light-emitting layers from an upper portion of the insulation films so as to overlap the regions corresponding to border regions between the plurality of pixels.

15. The fabrication method for an active-matrix light-emitting apparatus according to claim 14, the insulation films being formed in a shape in which side face sections are tapered and upper portions of the side face sections protrude from a lower portion.

16. The fabrication method for an active-matrix light-emitting apparatus according to claim 15, further comprising after forming the insulation films in the regions corresponding to the border portions between the plurality of pixels and the regions corresponding to the pixel electrode;

forming resist films in the regions corresponding to the border portions between the plurality of pixels on the insulation films so that adhesion between the resist films and the insulation films is greater than adhesion between the insulation films and lower layers; and etching the insulation films by using the resist films as anti-etching masks to produce the insulation films in forming the insulation films.

17. The fabrication method for an active-matrix light-emitting apparatus according to claim 14, the insulation films being formed in a two-step structure comprising a narrow lower portion and an upper portion wider than the lower portion, in each of which upper portions of side face sections protrude from a lower portion.

* * * * *